(12) United States Patent
Madeberg et al.

(10) Patent No.: US 9,172,126 B2
(45) Date of Patent: Oct. 27, 2015

(54) MODULE AND COUPLING ARRANGEMENT

(71) Applicant: Huawei Technologies Co., Ltd., Shenzhen (CN)

(72) Inventors: Bengt Madeberg, Stockholm (SE); Leif Bergstedt, Varberg (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/142,097

(22) Filed: Dec. 27, 2013

(65) Prior Publication Data
US 2014/0111292 A1    Apr. 24, 2014

Related U.S. Application Data

(63) Continuation of application No. PCT/CN2011/076794, filed on Jul. 4, 2011.

(51) Int. Cl.
*H01P 3/08* (2006.01)
*H01P 3/16* (2006.01)
*H01P 5/107* (2006.01)
*H01P 5/02* (2006.01)
*H05K 1/02* (2006.01)

(52) U.S. Cl.
CPC ............... *H01P 3/16* (2013.01); *H01P 5/028* (2013.01); *H01P 5/107* (2013.01); *H05K 1/0243* (2013.01)

(58) Field of Classification Search
USPC ........................................................ 333/246
See application file for complete search history.

(56) References Cited

U.S. PATENT DOCUMENTS

| 5,977,631 A | 11/1999 | Notani |
| 6,501,352 B1 * | 12/2002 | Koriyama et al. ............ 333/260 |
| 2010/0124390 A1 | 5/2010 | Kondo et al. |

FOREIGN PATENT DOCUMENTS

| CN | 101740896 A | 6/2010 |
| EP | 0200291 A2 | 2/1986 |
| EP | 1081989 A2 | 8/2000 |

(Continued)

OTHER PUBLICATIONS

Foreign Communication From A Counterpart Application, PCT Application No. PCT/CN2011/076794, International Search Report dated Apr. 12, 2012, 8 pages.

(Continued)

*Primary Examiner* — Lincoln Donovan
*Assistant Examiner* — Patrick Chen
(74) *Attorney, Agent, or Firm* — Conley Rose, P.C.; Grant Rodolph; Nicholas K. Beaulieu

(57) ABSTRACT

The application concerns a surface mount module adapted for transfer of a microwave signal between the module and a motherboard, the module comprising a substrate with a first microstrip conductor and a second microstrip conductor, wherein the two conductors are connected with a connection through the module. The module is distinguished in that the connection comprises the first microstrip conductor connected to a foil of electrically conducting material coated on the first side, the foil being surrounded by electrically conducting trenches running through the substrate from the first side to the second side forming a substrate integrated waveguide, wherein the trenches on the second side surrounds a second foil of electrically conducting material coated on the second side of the substrate and connected the second microstrip conductor. The application also concerns a coupling arrangement.

17 Claims, 7 Drawing Sheets

(56) References Cited

FOREIGN PATENT DOCUMENTS

| | | | |
|---|---|---|---|
| JP | 2001196815 A | | 7/2001 |
| JP | 2003264438 A | * | 9/2003 |
| JP | 2004120659 A | | 4/2004 |
| JP | 3619397 B2 | | 2/2005 |
| JP | 2006121540 A | | 5/2006 |
| JP | 3951532 B2 | | 8/2007 |
| JP | 4012796 B2 | | 11/2007 |
| WO | 2011030277 A2 | | 3/2011 |

OTHER PUBLICATIONS

Foreign Communication From A Counterpart Application, PCT Application No. PCT/CN2011/076794, Written Opinion dated Apr. 12, 2012, 4 pages.

Foreign Communication From A Counterpart Application, European Application No. 11867455.5, Extended European Search Report dated Mar. 7, 2014, 10 pages.

Partial English Translation and Abstract of Japanese Patent Application No. JP2004120659A, Jul. 17, 2014, 21 pages.

Partial English Translation and Abstract of Japanese Patent Application No. JP2006121540A, Jul. 17, 2014, 16 pages.

Foreign Communication From A Counterpart Application, Chinese Application No. 201180071552.6, Chinese Office Action dated Sep. 3, 2014, 4 pages.

Foreign Communication From A Counterpart Application, Chinese Application No. 201180071552.6, Chinese Search Report dated Aug. 25, 2014, 2 pages.

* cited by examiner

MODULE AND COUPLING ARRANGEMENT

CROSS-REFERENCE TO RELATED APPLICATION

This application is a continuation of International Application No. PCT/CN2011/076794, filed on Jul. 4, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The application relates to a surface mount module adapted for transfer of a microwave signal between the module and a motherboard. Further, it relates to a coupling arrangement.

BACKGROUND

To produce fully industrial high frequency microwave radio systems, it is a must to make them in a Surface Mount (SMT) process. This is due to several reasons: to have as low "built-up-value" components in the final manufacturing as possible, in order to reduce cost, and to lift out chip-attach technologies and wire-bonding from "in-house-manufacturing" at radio-manufacturers, since such technologies tend to be hard to automate, which also drives cost.

There are many different types of modules for microwave radio system that may be desired to be connected to a motherboard. One example is a package which may contain some kind of microwave electronics such as a filter or a microwave integrated circuit. Another type of module may be a smaller board (e.g., a sub-board) carrying several electrical components. All such modules, however, have in common that they must be connected to the main motherboard in such a way that microwave signals can be exchanged between them efficiently.

In the prior art SMT microwave signal systems, the transferring of signals between a motherboard and a module, for instance a surface mounted package, is mostly based on connections from a microstrip to a Coplanar Waveguide to a microstrip. They work well up to around 40-50 Gigahertz (GHz) and with some limitations up to 60 GHz.

For microwave radios and automotive radar around 75-85 GHz and above another approach, Chip On Board (COB) solutions mostly are used, i.e. the chip is directly mounted on and electrically interconnected to its final circuit board, instead of first being incorporated in a package that then can be mounted on a desired board. However, the chip on board model means higher technology in the end manufacturing and such solutions are also harder and more expensive to repair.

Such Chip On Board concepts allow full SMT-manufacturing of products that can transfer microwave signals with a frequency of up to around 120 GHz.

The prior art surface mounted module systems, mentioned above, will now be described a bit more with reference to FIGS. 1 and 2. They are based on a microstrip at the motherboard and also inside the package and an inter-connection by a Coplanar Waveguide-system. In this way, the lower microstrip is lifted up to a higher microstrip. This concept gives losses and limitations when signal frequencies are passing somewhere around 40 GHz.

Such a prior art coupling arrangement 1 is shown in FIG. 1. It discloses a motherboard 2 comprising a substrate 3 and a microstrip 4. The motherboard 2 is connected to a surface mount module 5, said module comprising a substrate 6 and a micro strip conductor 7. The connection 17 between the motherboard 2 and the module 5 is shown encircled with an oval in the figure. A via-hole 18 is shown interconnecting an underside with an upper side of the substrate 6 of the module 5. In FIG. 1, X-X denotes a cross section through the connection 17; this cross section is detailed in FIG. 2.

The cross section X-X of the connection between the motherboard and the module can be studied further in FIG. 2. The motherboard 2 is connected to the module 5 via a coplanar waveguide 20. The coplanar waveguide 20 comprises two ground conductors 21 each comprising a solder pad on each of the motherboard and the module with solder in between. The ground can be seen transported from the motherboard ground plane 19 through the motherboard, by way of vias 22, to the upper side of the motherboard. The coplanar waveguide 20 further comprises, in the same plane as the ground conductors 21, a signal conductor 23 comprising the microstrip on the motherboard connected with solder to a via-hole 18 leading up to the microstrip 7 on the upper side of the module 5.

This prior art arrangement is straightforward, however the transmission of signals from microstrip to Coplanar Waveguide to microstrip is hard to maintain with a "smooth" flow at higher frequencies, which results in losses.

SUMMARY

It is an object of the present application to propose a solution for or a reduction of the problems of prior art. A main object is consequently to provide a module that is suitable for surface mounting to a motherboard and allows for a transfer of signals with a high frequency.

This object is attained with a Substrate Integrated Waveguide (SIW) in the module that has an input at one side and output at the opposite side. This will give less loss than existing systems.

The surface mount module adapted for transfer of a microwave signal, according to the application comprises a substrate with a first microstrip conductor on a first side of the substrate and a second microstrip conductor on a second, opposite side of the substrate. The two conductors are connected with a connection through the module. The module is distinguished in that the connection comprises the first microstrip conductor connected to a foil of electrically conducting material coated on the first side of the substrate, the foil being surrounded by electrically conducting trenches running through the substrate from the first side to the second side of the substrate forming a substrate integrated waveguide. The trenches on the second side surrounds a second foil of electrically conducting material coated on the second side of the substrate and connected the second microstrip conductor.

By means of the application it is possible to have automatically assembled Surface Mount Device (SMD)-modules for signals above 40 GHz and maybe up to 100 GHz or even higher. This is not possible with the prior art.

Further advantageous embodiments are disclosed in the claims.

BRIEF DESCRIPTION OF THE DRAWINGS

Embodiments exemplifying the application will now be described in conjunction with the appended drawings, on which FIG. 1 discloses a surface mount module connecting to a motherboard according to prior art.

DETAILED DESCRIPTION

Figure 1:
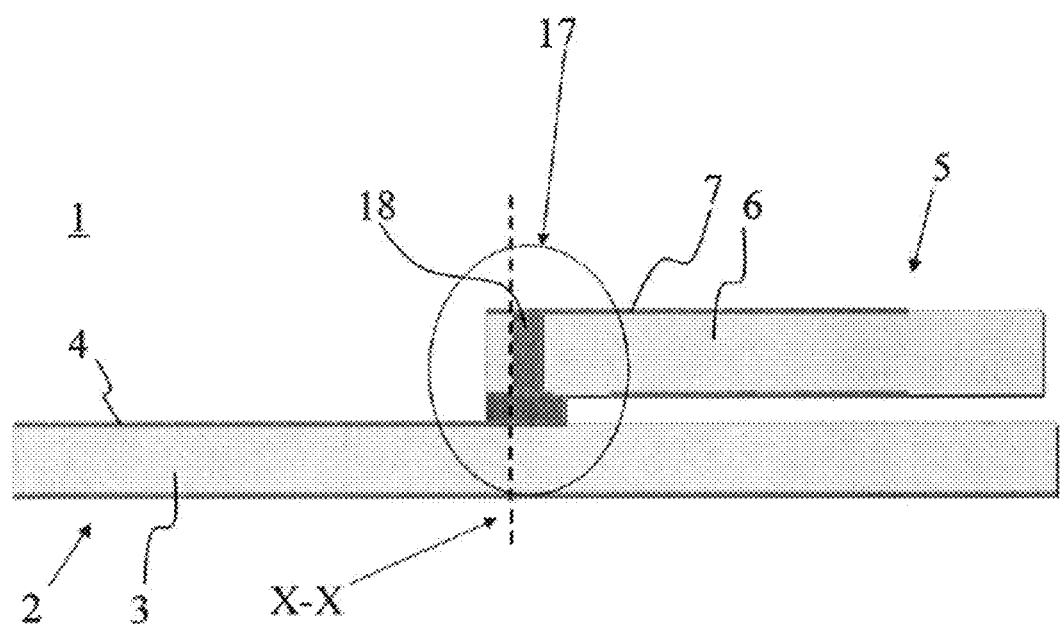
Figure 2:
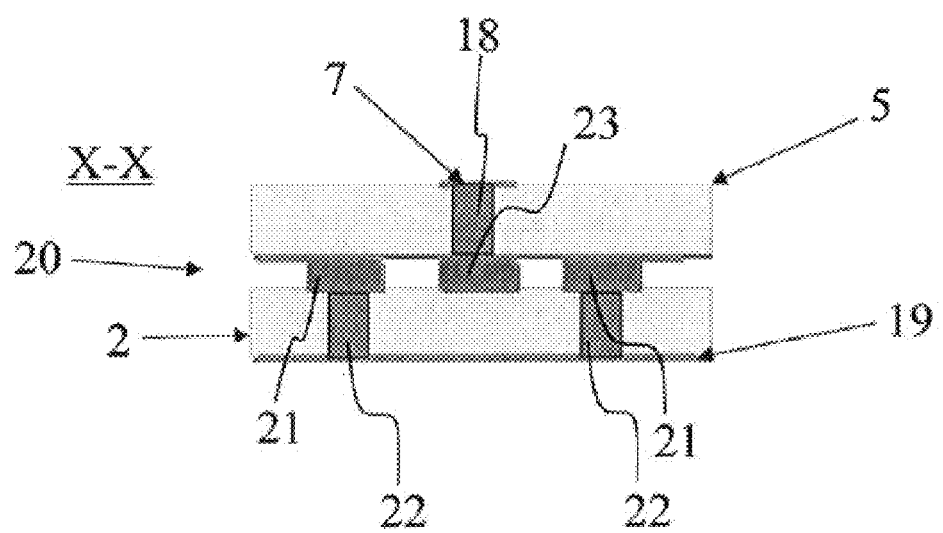
FIG. 2 discloses a close-up cross section of FIG. 1.

Some embodiments exemplifying the application will now be described. Features that have a correspondence in the prior art will be referenced with the same numerals as in the prior art FIGS. 1 and 2.

In this innovation an SIW-element will be used as a conduction element between an underside and an upper side of the module of the application. A substrate integrated waveguide is an electromagnetic waveguide formed in a dielectric substrate by forming metallized trenches or densely arranging metallized via-holes connecting upper and lower metal planes of the substrate. These trenches or via-holes correspond to the metal walls of an ordinary hollow electromagnetic waveguide.

Figure 3:
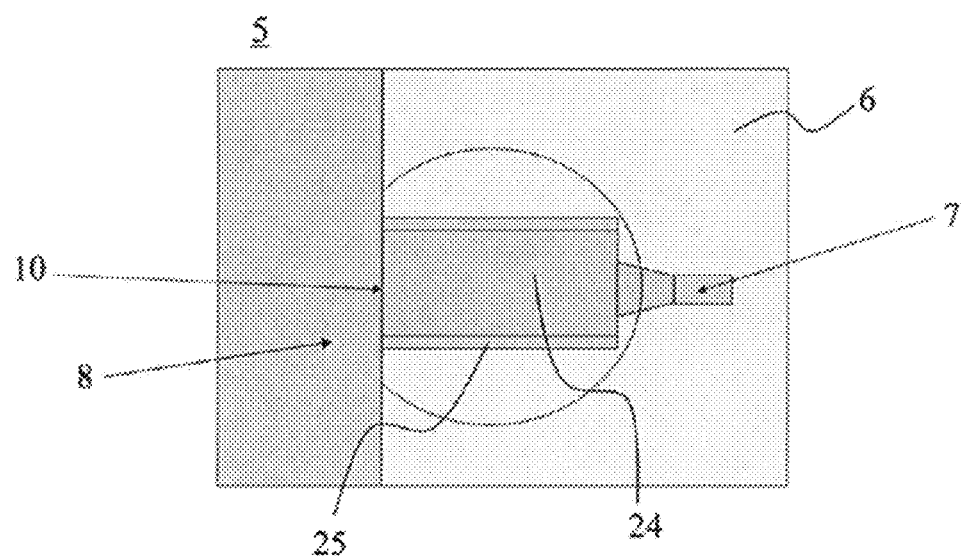
FIG. 3 discloses a top view of a portion of a module according to the application.
Figure 4:
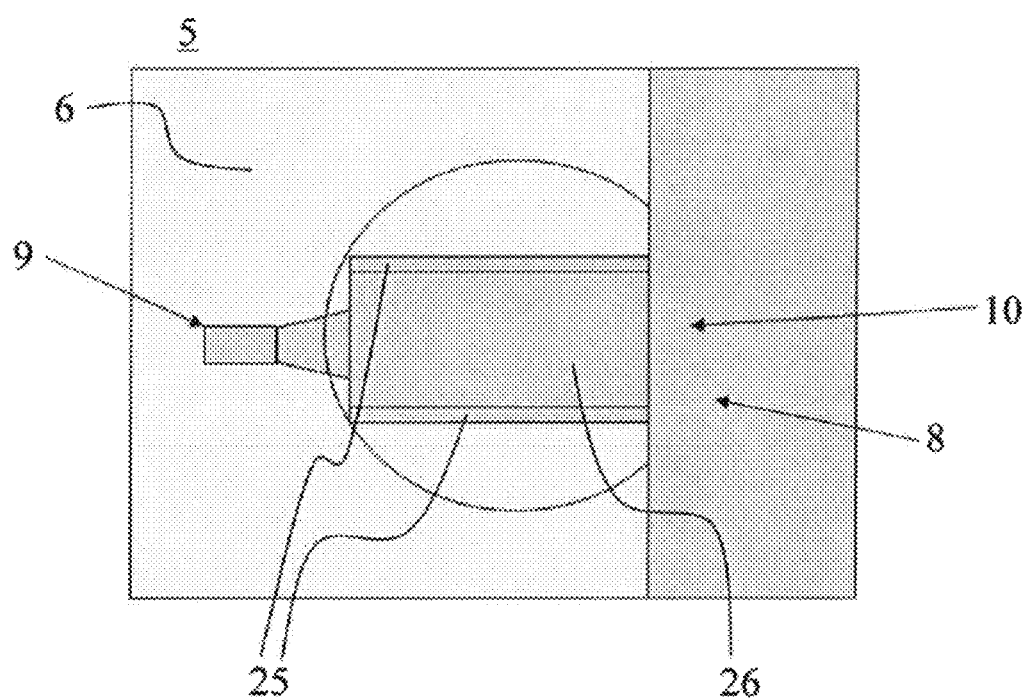
FIG. 4 discloses a bottom view of a portion of a module in accordance to the application.

A surface mount module 5 adapted for transfer of a microwave signal between the module 5 and a motherboard according to the application is shown, as an example, in FIGS. 3 and 4. FIG. 3 illustrates a first, upper side of the module 5. The upper side will face away from the motherboard when the module 5 is attached to the motherboard.

The module 5 comprises a substrate 6 with a first microstrip conductor 7 on the first side of the substrate 6 and a second microstrip conductor 9 (see FIG. 4) on a second, opposite side of the substrate. The two conductors 7, 9 are connected with a connection 10 through the module 5. According to the application the connection 10 comprises the first microstrip conductor 7 connected to a foil 24 of electrically conducting material coated on the first side of the substrate 6, the foil 24 being surrounded by electrically conducting trenches 25 running through the substrate 6 from the first side to the second side of the substrate 6 forming a substrate integrated waveguide 8. Further, as shown in FIG. 4, the trenches 25 on the second side surrounds a second foil 26 of electrically conducting material coated on the second side of the substrate 6 and connected the second microstrip conductor 9.

The second conductor 9 is adapted to be connected to a conductor on a motherboard, such that a microwave signal may be transferred between the motherboard and the module when the module is attached to the motherboard. The adaptation may for instance be in the form of a solder pad for surface mount soldering.

The trenches 25 of the module 5 according to the application, may be provided as a plurality of via-holes. In that case, the via-holes would be aligned in a row at suitable distances from each other. As a rule of thumb, the distances of the via-holes should be at most about ⅛ of a wavelength of a signal that is desired to be transferred in the waveguide.

The module 5 according to the application may be a surface mount package. Such a package can for instance contain a microwave integrated circuit or a microwave filter that needs to be connected to the motherboard. The module may also be a sub-module board comprising a plurality of circuits that needs to be connected to the motherboard.

Now, a further exemplary embodiment of the application will be described in conjunction with FIGS. 5-7. It is a coupling arrangement comprising a module 5 according to any of the previously described embodiments of the module connected to a motherboard 2. The FIGS. 5-7 discloses two connections between the motherboard and the module, however only one of the connections are described below, the other one is similar.

Figure 5:
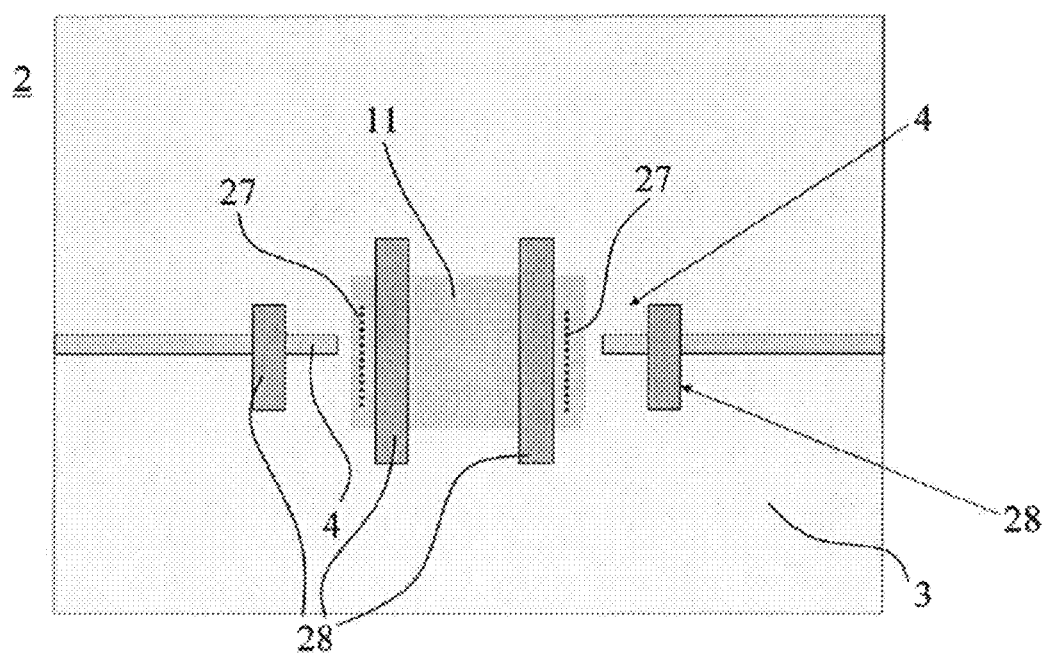
FIG. 5 discloses a top view of a portion of a motherboard according to the application.

In FIG. 5, the motherboard 2 is shown from the side which will face the module when they are connected. The motherboard 2 comprises a substrate 3 with a microstrip conductor 4. This side of the mother board is to be connected with the module 5 shown in FIG. 6. The connection is accomplished by having the second conductor 9 of the module 5 connected to the motherboard conductor 4; the actual connection is not shown in the figures. Also not shown in any of the figures is a ground plane of the motherboard on an opposite side of the motherboard conductor 4. This ground plane is connected by a through connection 27 to a ground patch 11 on the same side as the motherboard conductor 4, as seen in FIG. 5. The ground patch 11 of FIG. 5 is connected with the trenches 25 of the module 5 in FIG. 6 (the actual connection is not shown in the figures). In this way, a coupling arrangement is accomplished which allows a transfer of a microwave signal between the motherboard and the module with lower losses. A ground plane 6 of the module 5 is also shown in FIG. 6.

The through connection 27 of the motherboard in the coupling arrangement may for instance be a plurality of via-holes, as shown in FIG. 5. The patches 28 in FIG. 5 are solder masks used to control where solder is applied when mounting the module to the motherboard.

Figure 6:
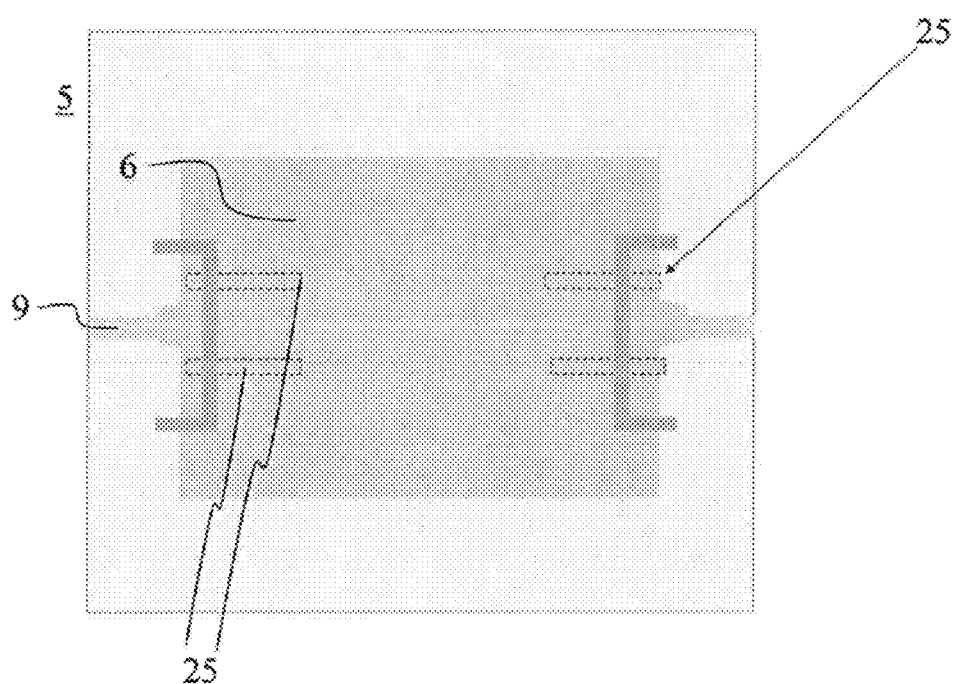
FIG. 6 discloses a bottom view of a portion of a module according to the application.
Figure 7:
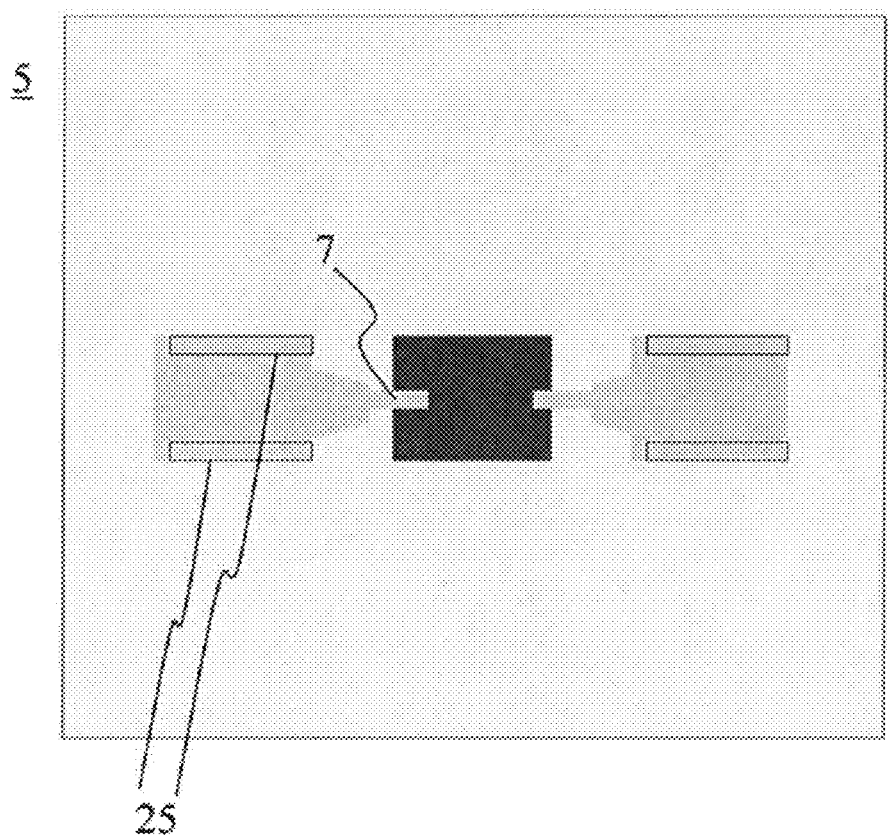
FIG. 7 discloses a top view of a portion of a module according to the application.

In FIG. 7, an opposite side to the one shown in FIG. 6, namely a top view of the module 5, is shown. The substrate integrated waveguide with the trenches 25 are shown. These trenches 25 constitutes the opposite side of the substrate integrated waveguide trenches shown in FIG. 6. In FIG. 7, the waveguide is connected to a microstrip conductor 7 which then connects to a circuit providing some microwave functionality. This circuit is schematically indicated as a grey square in the centre of FIG. 7.

It should be noted that only the parts of the motherboard and the module respectively that are of interest to elucidate the coupling arrangement of the application are shown in FIGS. 5-7. It is understood that in other parts of the motherboard and the module, other components are/maybe provided. This is also true for the embodiment of the module shown in FIGS. 3 and 4.

What is claimed is:

1. A surface mount module adapted for transfer of a microwave signal between the surface mount module and a motherboard, the surface mount module comprising:
   a substrate;
   a first microstrip conductor on a first side of the substrate; and
   a second microstrip conductor on a second, opposite side of the substrate,
   wherein the first microstrip conductor and the second microstrip conductor are connected with a connection through the surface mount module, wherein the connection comprises the first microstrip conductor being connected to a first foil of electrically conducting material coated on the first side of the substrate, wherein the first foil comprises an approximately rectangular shape having first, second, third, and fourth sides, wherein the first and third sides are opposite one another, and the first microstrip conductor is in direct contact with the first foil, wherein the first foil is surrounded by electrically conducting trenches running through the substrate from the first side to the second side of the substrate forming a substrate integrated waveguide, wherein the trenches on the second side surround a second foil of electrically conducting material coated on the second side of the substrate and connected to the second microstrip conductor, and wherein the second foil comprises the approximately rectangular shape having first, second, third, and fourth sides, wherein the first and third sides are opposite one another, and the second microstrip conductor is in direct contact with the second foil, and wherein the trenches are located only along the first side and the third side of the first foil, wherein the first microstrip conductor is located at the second side of the first foil, and wherein the trenches are located only along the first side and the third side of the second foil, and wherein the second microstrip conductor is located at the second side of the second foil.

2. The surface mount module according to claim 1, wherein the second conductor is adapted to be connected to a conductor on the motherboard.

3. The surface mount module according to claim 1, wherein the trenches are a plurality of via-holes.

4. The surface mount module according to claim 1, wherein the module is a surface mount package.

5. The surface mount module according to claim 1, wherein the trenches comprise a plurality of via-holes, and wherein distances between each of the plurality of via-holes comprise one-eighth of a wavelength of a signal transferred in the surface mount module.

6. The surface mount module according to claim 1, wherein the first foil comprises a continuous piece of conducting material that extends between the first side, the second side, the third side, and the fourth side of the first foil, and wherein the second foil comprises another continuous piece of conducting material that extends between the first side, the second side, the third side, and the fourth side of the second foil.

7. A coupling arrangement comprising:
a motherboard; and
a surface mount module connected to the motherboard,
wherein the surface mount module comprises a substrate, a first microstrip conductor on a first side of the substrate, and a second microstrip conductor on a second, opposite side of the substrate,
wherein the first microstrip conductor and the second microstrip conductor are connected with a connection through the surface mount module,
wherein the connection comprises the first microstrip conductor being connected to a first foil of electrically conducting material coated on the first side of the substrate,
wherein the first foil comprises an approximately rectangular shape having first, second, third, and fourth sides, wherein the first and third sides are opposite one another, and the first microstrip conductor is in direct contact with the first foil,
wherein the first foil is surrounded by electrically conducting trenches running through the substrate from the first side to the second side of the substrate forming a substrate integrated waveguide,
wherein the trenches on the second side surround a second foil of electrically conducting material coated on the second side of the substrate and connected to the second microstrip conductor,
wherein the second foil comprises the approximately rectangular shape having first, second, third, and fourth sides, wherein the first and third sides are opposite one another, and the second microstrip conductor is in direct contact with the second foil,
wherein the motherboard comprises a substrate with a motherboard conductor,
wherein the second microstrip conductor of the surface mount module is connected to the motherboard conductor,
wherein a ground plane of the motherboard on an opposite side of the motherboard conductor is connected by a through connection to a ground patch on the same side as the motherboard conductor,
wherein the trenches are located only along the first side and the third side of the first foil, wherein the first microstrip conductor is located at the second side of the first foil, and wherein the trenches are located only along the first side and the third side of the second foil, and wherein the second microstrip conductor is located at the second side of the second foil, and
wherein the ground patch is connected with the trenches of the surface mount module.

8. The coupling arrangement according to claim 7, wherein the through connection is a plurality of via-holes.

9. The coupling arrangement according to claim 7, wherein the module is a surface mount package.

10. The coupling arrangement according to claim 7, wherein the trenches comprise a plurality of via-holes, and wherein distances between each of the plurality of via-holes comprise one-eighth of a wavelength of a signal transferred in the surface mount module.

11. The coupling arrangement according to claim 7, wherein the first foil comprises a continuous piece of conducting material that extends between the first side, the second side, the third side, and the fourth side of the first foil, and wherein the second foil comprises another continuous piece of conducting material that extends between the first side, the second side, the third side, and the fourth side of the second foil.

12. An apparatus comprising:
a motherboard; and
a surface mount module connected to the motherboard,
wherein the surface mount module comprises a substrate, a first microstrip conductor on a first side of the substrate, and a second microstrip conductor on a second, opposite side of the substrate,
wherein the first microstrip conductor and the second microstrip conductor are connected with a connection through the surface mount module,
wherein the connection comprises the first microstrip conductor being connected to a first foil of electrically conducting material coated on the first side of the substrate,
wherein the first foil comprises an approximately rectangular shape having first, second, third, and fourth sides, wherein the first and third sides are opposite one another, and the first microstrip conductor is in direct contact with the first foil,
wherein the first foil is surrounded by electrically conducting trenches running through the substrate from the first side to the second side of the substrate forming a substrate integrated waveguide, wherein the trenches on the second side surround a second foil of electrically conducting material coated on the second side of the substrate and connected to the second microstrip conductor, and wherein the second foil comprises the approximately rectangular shape having first, second, third, and fourth sides, wherein the first and third sides are opposite one another, and the second microstrip conductor is in direct contact with the second foil, and wherein the trenches are located only along the first side and the third side of the first foil, wherein the first microstrip conductor is located at the second side of the first foil, and wherein the trenches are located only along the first side and the third side of the second foil, and wherein the second microstrip conductor is located at the second side of the second foil.

13. The apparatus according to claim 12, wherein the motherboard comprises a substrate with a motherboard conductor, wherein the second microstrip conductor of the surface mount module is connected to the motherboard conductor, wherein a ground plane of the motherboard on an opposite side of the motherboard conductor is connected by a through connection to a ground patch on the same side as the motherboard conductor, and wherein the ground patch is connected with the trenches of the surface mount module.

14. The apparatus according to claim 13, wherein the through connection is a plurality of via-holes.

15. The apparatus according to claim 12, wherein the module is a surface mount package.

16. The apparatus according to claim 12, wherein the trenches comprise a plurality of via-holes, and wherein distances between each of the plurality of via-holes comprise one-eighth of a wavelength of a signal transferred in the surface mount module.

17. The apparatus according to claim 12, wherein the first foil comprises a continuous piece of conducting material that extends between the first side, the second side, the third side, and the fourth side of the first foil, and wherein the second foil comprises another continuous piece of conducting material that extends between the first side, the second side, the third side, and the fourth side of the second foil.

* * * * *